(12) United States Patent
White et al.

(10) Patent No.: US 12,203,990 B2
(45) Date of Patent: Jan. 21, 2025

(54) SYSTEMS AND METHODS FOR MONITORING HEALTH OF A MOTOR

(71) Applicant: BETA AIR, LLC, South Burlington, VT (US)

(72) Inventors: Brandon White, South Burlington, VT (US); Stephen Widdis, South Burlington, VT (US)

(73) Assignee: BETA AIR LLC, South Burlington, VT (US)

( * ) Notice: Subject to any disclaimer, the term of this patent is extended or adjusted under 35 U.S.C. 154(b) by 261 days.

(21) Appl. No.: 17/858,619

(22) Filed: Jul. 6, 2022

(65) Prior Publication Data

US 2023/0152377 A1   May 18, 2023

Related U.S. Application Data

(63) Continuation-in-part of application No. 17/528,526, filed on Nov. 17, 2021, now Pat. No. 11,411,474.

(51) Int. Cl.
*G01R 31/34* (2020.01)
*G01J 5/48* (2022.01)

(52) U.S. Cl.
CPC ............. *G01R 31/343* (2013.01); *G01J 5/48* (2013.01)

(58) Field of Classification Search
CPC ...... G01J 5/48; G01J 2005/0077; G01J 5/025; G01J 5/026; G01J 5/0022; G01R 31/008;
(Continued)

(56) References Cited

U.S. PATENT DOCUMENTS

| 5,519,300 A | 5/1996 | Leon et al. |
| 5,726,911 A | 3/1998 | Canada et al. |

(Continued)

FOREIGN PATENT DOCUMENTS

| GB | 2484960 A | 5/2012 |
| IN | 00043DE2015 A | 8/2016 |

(Continued)

OTHER PUBLICATIONS

Samuel and Lin, Airvolt Aircraft Electric Propulsion Test Stand, 2015, AIAA Propulsion and Energy Conference 2015, No. DFRC-E-DAA-TN24260, pp. 1-19, downloaded from: https://ntrs.nasa.gov/api/citations/20160001339/downloads/20160001339.pdf on May 20, 2024. (Year: 2015).*

(Continued)

*Primary Examiner* — Jeffery A Brier
(74) *Attorney, Agent, or Firm* — Brake Hughes Bellermann LLP

(57) ABSTRACT

In an aspect of the present disclosure is a system for monitoring health of a motor, including at least one sensor configured to detect at least a motor metric and send motor datum based on the at least a motor metric, an augmented reality display configured to display a visual representation of the motor datum, and a computing device communicatively connected to the at least one sensor and the augmented reality display, wherein the computing device is configured to: receive the motor datum from the at least one sensor; and command the augmented reality display to display the visual representation of the motor datum.

18 Claims, 7 Drawing Sheets

(58) Field of Classification Search
CPC ...... G01R 31/343; H02K 11/20; H02K 15/00; H02K 11/25; H02P 29/024; H02P 29/60; H02P 23/0018; G02B 2027/014; G02B 2027/0141; G02B 27/0101; G06F 3/147; G09G 2380/10; G09G 2380/12

See application file for complete search history.

(56) References Cited

U.S. PATENT DOCUMENTS

| | | | |
|---|---|---|---|
| 5,917,428 | A | 6/1999 | Discenzo et al. |
| 6,128,583 | A | 10/2000 | Dowling |
| 6,289,735 | B1 | 9/2001 | Dister et al. |
| 6,529,135 | B1 | 3/2003 | Bowers et al. |
| 7,996,337 | B2 | 8/2011 | Flickinger |
| 8,981,697 | B2 | 3/2015 | Zeller |
| 10,336,472 | B2 | 7/2019 | Nicks et al. |
| 10,488,282 | B2 | 11/2019 | Guru et al. |
| 11,050,378 | B2 | 6/2021 | Polcuch et al. |
| 11,411,474 | B1* | 8/2022 | White ............... H02K 11/27 |
| 2012/0280644 | A1* | 11/2012 | Lind ............... H02P 29/60 318/476 |
| 2019/0049517 | A1* | 2/2019 | Choi ............... G01R 31/367 |
| 2019/0204390 | A1 | 7/2019 | Krishnamoorthi et al. |
| 2020/0026269 | A1 | 1/2020 | Needham et al. |
| 2020/0103894 | A1* | 4/2020 | Cella ............... G05B 23/0289 |
| 2020/0160607 | A1* | 5/2020 | Kjallstrom ............ G06T 19/006 |
| 2020/0403537 | A1 | 12/2020 | Jefferies et al. |
| 2021/0304523 | A1* | 9/2021 | Tanada ............... G07C 5/008 |

FOREIGN PATENT DOCUMENTS

| | | |
|---|---|---|
| WO | 2008116966 A2 | 10/2008 |
| WO | 2021009042 A1 | 1/2021 |

OTHER PUBLICATIONS

A. S. Zheltov, N. V. Kuzmin and D. S. Khriukin, Augmented Reality Technologies in Diagnosis of Electrical Machines, Jun. 2019, 2019 International Conference on Industrial Engineering, Applications and Manufacturing (ICIEAM), doi: 10.1109/ICIEAM.2019. 8742992, pp. 1-5. (Year: 2019).*

Israel Zamudio-Ramirez 1 , Roque Alfredo Osornio-Rios 1 , Miguel Trejo-Hernandez 1 , Rene De Jesus Romero-Troncoso 1 And Jose Alfonso Antonino-Daviu, Smart-Sensors to Estimate Insulation Health in Induction Motors via Analysis of Stray Flux, May 1, 2019.

D K Chaturvedi, A Karimpour, M P Singh, Health Monitoring of Induction Motor Using Sound Signals, Feb. 5, 2020.

Jinjiang Wang , Peilun Fu, Laibin Zhang, Robert X. Gao, Fellow, IEEE, and Rui Zhao, Multilevel Information Fusion for Induction Motor Fault Diagnosis, Oct. 1, 2019.

Nguyen Cong Phuong, Condition Monitoring for Induction Motor Overload Using Sound, Apr. 3, 2021.

* cited by examiner

SYSTEMS AND METHODS FOR MONITORING HEALTH OF A MOTOR

CROSS-REFERENCE TO RELATED APPLICATIONS

This application is a continuation-in-part of Non-provisional application Ser. No. 17/528,526 filed on Nov. 17, 2021 and entitled "SYSTEMS AND METHODS FOR MONITORING HEALTH OF A MOTOR," the entirety of which is incorporated herein by reference.

FIELD OF THE INVENTION

The present invention generally relates to the field of motors. In particular, the present invention is directed to systems and methods for monitoring health of a motor.

BACKGROUND

Motor monitors may aid in alerting a user of potential issues with a motor. Motor monitors may be limited in the information displayed and may distract from operation of an electric vehicle.

SUMMARY OF THE DISCLOSURE

In an aspect, a system for monitoring health of a motor is disclosed. The system comprises at least a electric propulsor, wherein the at least a electric propulsor comprises at least a motor. The system also comprises at least a sensor configured to detect at least a motor metric of the at least a motor. The sensor may send a motor datum based on the at least a motor metric. The system may include a computing device communicatively connected to the at least a sensor. The computing device may be configured to receive the motor datum from the at least a sensor. The computing device may then display a visual representation of the motor datum.

In another aspect, a method for monitoring the health of a motor, including detecting, using at least a sensor, at least a motor metric of at least a motor of at least an electric propulsor. The method further including sending, by the at least a sensor, a motor datum based on the at least a motor metric. The method further including receiving, at the computing device, the motor datum. The method further including displaying, by the computing device, the motor datum.

These and other aspects and features of non-limiting embodiments of the present invention will become apparent to those skilled in the art upon review of the following description of specific non-limiting embodiments of the invention in conjunction with the accompanying drawings.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein.

The drawings are not necessarily to scale and may be illustrated by phantom lines, diagrammatic representations, and fragmentary views. In certain instances, details that are not necessary for an understanding of the embodiments or that render other details difficult to perceive may have been omitted.

DETAILED DESCRIPTION

At a high level, aspects of the present disclosure are directed to systems and methods for monitoring health of a motor. The system may comprise at least a electric propulsor, wherein the at least a electric propulsor comprises at least a motor. The system may also comprise at least a sensor configured to detect at least a motor metric of the at least a motor. The sensor may send a motor datum based on the at least a motor metric. The system may include a computing device communicatively connected to the at least a sensor. The computing device may be configured to receive the motor datum from the at least a sensor. The computing device may then display a visual representation of the motor datum. Exemplary embodiments illustrating aspects of the present disclosure are described below in the context of several specific examples.

Figure 1:
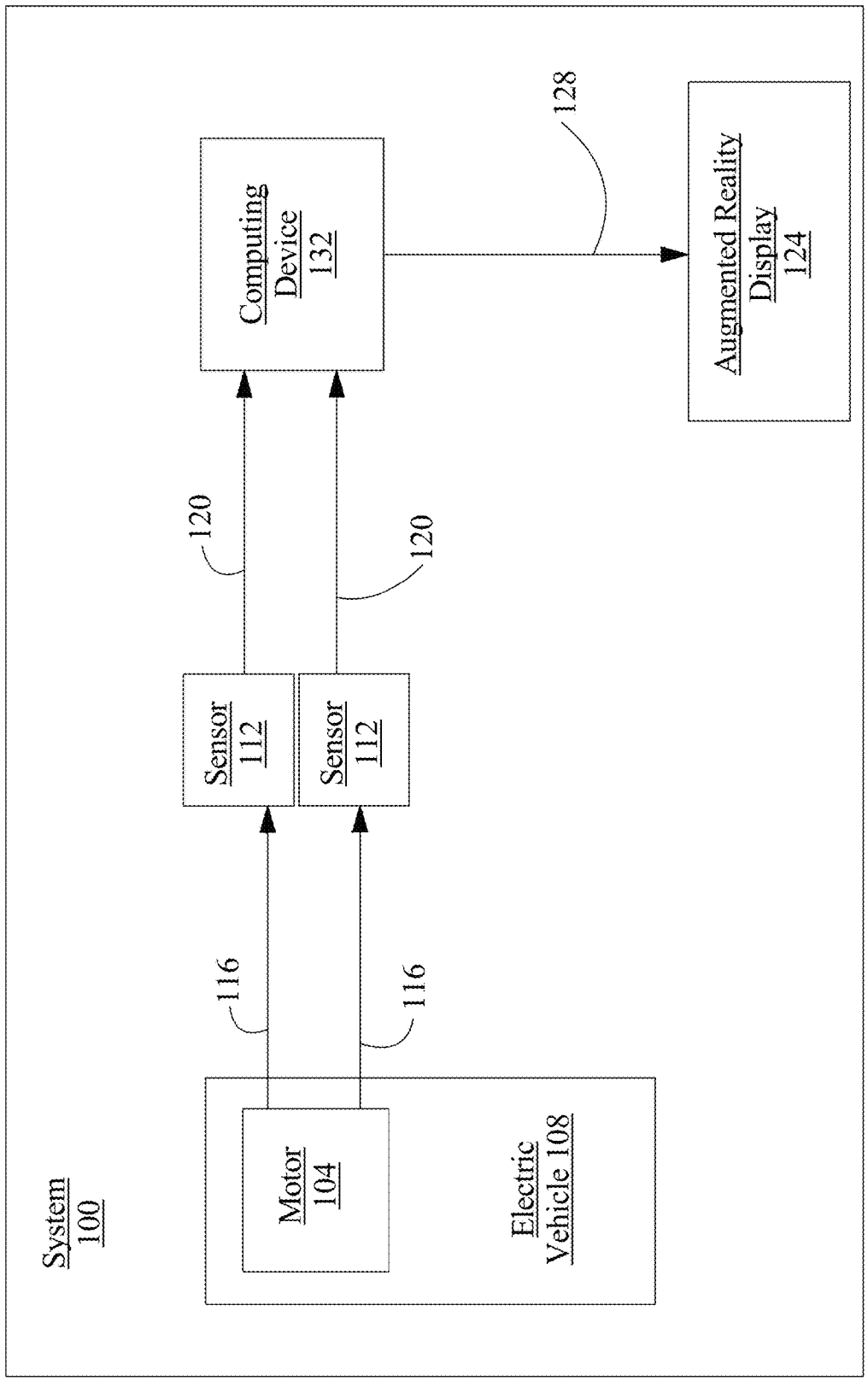
FIG. 1 is a block diagram illustrating a system for monitoring health of a motor according to an embodiment of the disclosure.

Referring now to FIG. 1, an exemplary embodiment of a system 100 for monitoring health of a motor 104 is illustrated. As used in this disclosure, "motor" may include an electric motor and may be defined as a device that converts electrical energy into mechanical energy, for instance by causing a shaft to rotate. An electric motor may be driven by direct current (DC) electric power. As an example and without limitation, an electric motor may include a brushed DC electric motor or the like. An electric motor may be, without limitation, driven by electric power having varied or reversing voltage levels, such as alternating current (AC) power as produced by an alternating current generator and/or inverter, or otherwise varying power, such as produced by a switching power source. An electric motor may include, for example and without limitation, brushless DC electric motors, permanent magnet synchronous an electric motor, switched reluctance motors, or induction motors. In addition to inverter and/or a switching power source, a circuit driving an electric motor may include electronic speed controllers (not shown) or other components for regulating motor speed, rotation direction, and/or dynamic braking. As used in this disclosure, motor 104 may be used in an electric vehicle 108 such as an electric automobile and an electric aircraft, including an electrical vertical takeoff and landing (eVTOL) aircraft, a helicopter, a commercial aircraft, an unmanned aerial vehicle, a rotorcraft, and the like.

Still referring to FIG. 1, system 100 includes at least one sensor 112 configured to detect at least a motor metric 116 and send motor datum 120 based on the at least a motor metric 116. As used in this disclosure, a "sensor" is a device that is configured to detect an input and/or a phenomenon and transmit information related to the detection; sensor may include one or more sensors. For example, and without limitation, sensor 112 may transduce a detected phenomenon, such as at least a motor metric 116. As used in this disclosure, a "motor metric" is a phenomenon associated with motor 104. At least a motor metric 116 may include temperature, humidity, electrical properties including current and voltage, positioning, vibration, sound, strain, torque, and rotational speed of motor 104 and components of motor 104; at least a motor metric 116 may include a physical value, electrical value, or combination thereof. As used in this disclosure, "motor datum" is an element of data encoding one or more motor metrics in an electrical signal such as a binary, analog, pulse width modulated, or other signal. For example, and without limitation, sensor 112 may transduce a detected phenomenon and/or characteristic of motor 104, such as, and without limitation, temperature, voltage, current, pressure, temperature, moisture level, and the like, into a sensed signal. Sensor 112 may detect a plurality of data about motor 104 and circuitry electrically connected to the motor 104. In some embodiments, sensor 112 may include a plurality of sensing devices, such as, but not limited to, temperature sensors, humidity sensors, accelerometers, electrochemical sensors, gyroscopes, magnetometers, inertial measurement unit (IMU), pressure sensor, proximity sensor, displacement sensor, force sensor, vibration sensor, air detectors, hydrogen gas detectors, and the like.

With continued reference to FIG. 1, system 100 may include sensor 112. In some embodiments, sensor 112 may be configured to measure a vibration datum of propulsor. A propulsor is discussed in more detail herein below in FIG. 3. A "vibration datum," as used in this disclosure, is a datum that measures and/or characterizes a vibration of an object. A "vibration" as used in this disclosure is an oscillation about an equilibrium point of an object. Sensor 112 may be configured to transmit vibrational data of propulsor to a computing device 132. Sensor 112 may be integrated into propulsor, a portion thereof, or any subcomponent thereof. Sensor 112 may include circuitry or electronic components configured to digitize, transform, or otherwise manipulate electrical signals. Electrical signals may include analog signals, digital signals, periodic or aperiodic signal, step signals, unit impulse signal, unit ramp signal, unit parabolic signal, signum function, exponential signal, rectangular signal, triangular signal, sinusoidal signal, sinc function, or pulse width modulated signal. Sensor 112 may generate vibration datum of propulsor. Sensor 112 may include a motion sensor. A "motion sensor," for the purposes of this disclosure, is a device or component configured to detect physical movement of an object or group of objects. One of ordinary skill in the art would appreciate, after reviewing the entirety of this disclosure, that motion may include a plurality of types including, but not limited to, spinning, rotating, oscillating, gyrating, jumping, sliding, reciprocating, or the like. Sensor 112 may include, torque sensor, gyroscope, accelerometer, torque sensor, magnetometer, inertial measurement unit (IMU), pressure sensor, force sensor, proximity sensor, displacement sensor, vibration sensor, among others. Sensor 112 may include a sensor suite which may include a plurality of sensors that may detect similar or unique phenomena. For example, in a non-limiting embodiment, sensor suite may include a plurality of accelerometers, a mixture of accelerometers and gyroscopes, or a mixture of an accelerometer, gyroscope, and torque sensor. The herein disclosed system and method may comprise a plurality of sensors in the form of individual sensors or a sensor suite working in tandem or individually. A sensor suite may include a plurality of independent sensors, as described herein, where any number of the described sensors may be used to detect any number of physical or electrical quantities associated with an aircraft power system or an electrical energy storage system. Independent sensors may include separate sensors measuring physical or electrical quantities that may be powered by and/or in communication with circuits independently, where each may signal sensor output to a control circuit such as a user graphical interface. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability to detect phenomenon is maintained. Vibration datum may be consistent with disclosure of vibration datum in U.S. patent application Ser. No. 17/515,430 filed on Oct. 30, 2021 and entitled "SYSTEM AND METHOD FOR VIBRATION MONITORING OF AN ELECTRIC AIRCRAFT," which is incorporated by reference herein in its entirety.

With continued reference to FIG. 1, system 100 may include computing device 132. In some embodiments, computing device 132 may include a proportional-integral-derivative (PID) controller. Computing device 132 may be as described in further detail below with reference to FIG. 6. Computing device 132 may be coupled to an electric aircraft. In some embodiments, computing device 132 may be in electrical communication with sensor 112. In some embodiments, computing device 132 may be configured to receive vibration data of propulsor from sensor 112. Computing device 132 may be configured to generate vibration datum of propulsor. In some embodiments, vibration datum may include a vibrational intensity of propulsor. A vibrational intensity may be measured by an acceleration of propulsor. In some embodiments, a vibrational datum may include a vibration amplitude. A vibration amplitude may include a displacement of propulsor from an origin point. An origin point may include a point at which propulsor normally operates at. Vibration datum may include a period of time of vibrational forces acting on propulsor. Vibration datum may include data about different vibrational forces acting on different parts of propulsor. In a non-limiting example, vibrational datum may detect a vibrational force acting on a stator of propulsor that may be different from a vibrational force acting on a rotor of propulsor. In some embodiments, vibration datum may include a history of vibrational forces that may have acted on propulsor. Vibration datum may include a vibration threshold of propulsor. A vibration threshold may include a vibrational value that may damage propulsor. In some embodiments, a vibration threshold may include a resonant frequency of propulsor. A "resonant frequency" as used in this disclosure is a phenomenon of increased amplitude that occurs when a frequency of a periodically applied force is equal or close to a natural frequency of the system on which it acts. A vibration acting on propulsor that is close or at a resonant frequency may lead to major physical damage of propulsor. A vibration threshold may include a specific vibrational value above or below a resonant frequency of propulsor. In some embodiments, vibration datum may include a plurality of resonant frequencies of a plurality of propulsors. A plurality of resonant frequencies may include resonant frequencies relating to different propulsor sizes, shapes, aerodynamics, materials, or other factors.

In one or more embodiments, and without limitation, sensor 112 may include a plurality of sensors. In one or more embodiments, and without limitation, sensor 112 may include one or more temperature sensors, voltmeters, current sensors, hydrometers, infrared sensors, photoelectric sensors, ionization smoke sensors, motion sensors, pressure sensors, radiation sensors, level sensors, imaging devices, moisture sensors, gas and chemical sensors, flame sensors, electrical sensors, imaging sensors, force sensors, Hall sensors, and the like. Sensor 112 may be a contact or a non-contact sensor. For instance, and without limitation, sensor 112 may be connected to motor 104 and/or a computing device. In other embodiments, sensor 112 may be remote to motor 104 and/or a computing device. As discussed further in this disclosure below, a computing device may include a processor, a pilot control, a controller, such as a flight controller, and the like. In one or more embodiments, sensor 112 may transmit/receive signals to/from a computing device. Signals may include electrical, electromagnetic, visual, audio, radio waves, or another undisclosed signal type alone or in combination.

Still referring to FIG. 1, sensor 112 may include a motion sensor. A "motion sensor," for the purposes of this disclosure, refers to a device or component configured to detect physical movement of an object or grouping of objects. One of ordinary skill in the art would appreciate, after reviewing the entirety of this disclosure, that motion may include a plurality of types including but not limited to: spinning, rotating, oscillating, gyrating, jumping, sliding, reciprocating, or the like. Sensor 112 may include, torque sensor, gyroscope, accelerometer, torque sensor, magnetometer, inertial measurement unit (IMU), pressure sensor, force sensor, proximity sensor, displacement sensor, vibration sensor, among others. Sensor 112 may generate an output torque datum. An "output torque datum," for the purposes of this disclosure, is an element of data that represents a physical value, electrical value, or combination thereof. In a non-limiting embodiment, sensor 112 may detect the torque produced by a propulsor and translate that torque value into an electrical signal that represents that value for use in later processing or steps consistent with the entirety of this disclosure. For example, sensor 112 may be configured to measure an output torque produced by a propulsor of motor 104. Output torque datum may be consistent with disclosure of output torque datum in U.S. patent application Ser. No. 17/186,079 filed on Feb. 26, 2021, and titled "METHODS AND SYSTEM FOR ESTIMATING PERCENTAGE TORQUE PRODUCED BY A PROPULSOR CONFIGURED FOR USE IN AN ELECTRIC AIRCRAFT", which is incorporated by reference herein in its entirety.

In some embodiments, sensor 112 may include a strain gauge configured to detect a strain, force, pressure, and/or load associated with motor 104. Strain gauge may include a pressure sensor. A "pressure," for the purposes of this disclosure, and as would be appreciated by someone of ordinary skill in the art, is a measure of force required to stop a fluid from expanding and is usually stated in terms of force per unit area. In non-limiting exemplary embodiments, pressure sensor may be configured to measure an atmospheric pressure and/or a change of atmospheric pressure. In some embodiments, pressure sensor may include an absolute pressure sensor, a gauge pressure sensor, a vacuum pressure sensor, a differential pressure sensor, a sealed pressure sensor, and/or other unknown pressure sensors or alone or in a combination thereof. Pressure sensor may include a barometer. In some embodiments, pressure sensor may be used to indirectly measure fluid flow, speed, water level, and altitude. In some embodiments, pressure sensor may be configured to transform a pressure into an analogue electrical signal. In some embodiments, pressure sensor may be configured to transform a pressure into a digital signal. In some embodiments, strain gauge may include a force transducer is as a load cell.

With continued reference to FIG. 1, in one or more embodiments, sensor 112 may include a moisture sensor. "Moisture," as used in this disclosure, is the presence of water, which may include vaporized water in air, condensation on the surfaces of objects, or concentrations of liquid water. Moisture may include humidity. "Humidity," as used in this disclosure, is the property of a gaseous medium (almost always air) to hold water in the form of vapor. An amount of water vapor contained within a parcel of air can vary significantly. Water vapor is generally invisible to the human eye and may be damaging to electrical components. There are three primary measurements of humidity, absolute, relative, specific humidity. "Absolute humidity," for the purposes of this disclosure, describes the water content of air and is expressed in either grams per cubic meters or grams per kilogram. "Relative humidity," for the purposes of this disclosure, is expressed as a percentage, indicating a present stat of absolute humidity relative to a maximum humidity given the same temperature. "Specific humidity," for the purposes of this disclosure, is the ratio of water vapor mass to total moist air parcel mass, where parcel is a given portion of a gaseous medium. Humidity sensor may be a psychrometer. Humidity sensor may be a hygrometer. Humidity sensor may be configured to act as or include a humidistat. A "humidistat," for the purposes of this disclosure, is a humidity-triggered switch, often used to control another electronic device. Humidity sensor may use capacitance to measure relative humidity and include in itself, or as an external component, include a device to convert relative humidity measurements to absolute humidity measurements. "Capacitance," for the purposes of this disclosure, is the ability of a system to store an electric charge, in this case the system is a parcel of air which may be near, adjacent to, or above a battery cell.

Still referring to FIG. 1, sensor 112 may include a geospatial sensor. As used in this disclosure, a geospatial sensor may include optical/radar/Lidar and/or a Global Positioning System (GPS), and may be used to detect the location, speed, and altitude of electric vehicle 108 and whether the electric vehicle 108 is on the correct location of a flight plan. Geospatial sensor may also be configured to determine the orientation of motor 104 relative to electric vehicle 108. In some embodiments, sensor 112 may include a sound sensor. Sound sensor may include an electromagnetic noise sensor configured to detect electromagnetic noise associated with motor 104 and/or an inverter electrically coupled to motor 104. In some embodiments, sound sensor may include a microphone configured to detect soundwaves emanating from motor 104 or a component that is communicatively connected to the motor 104. As used herein, "communicatively connected" is a process whereby one device, component, or circuit is able to receive data from and/or transmit data to another device, component, or circuit. Sensor 112 may include a vibrometer configured to detect vibrations of motor 104 and of components communicatively connected to the motor 104. Vibrometer may include a single-point vibrometer, scanning vibrometer, holographic laser Doppler vibrometer, rotational vibrometer, differential vibrometer, multi-beam vibrometer, self-mixing vibrometer, continuous scan laser Doppler vibrometer, and the like.

Still referring to FIG. 1, sensor 112 may include electrical sensors. Electrical sensors may be configured to measure voltage across a component, electrical current through a component, and resistance of a component. In one or more embodiments, sensor may include thermocouples, thermistors, thermometers, infrared sensors, resistance temperature sensors (RTDs), semiconductor based integrated circuits (ICs), a combination thereof, or another undisclosed sensor type, alone or in combination. Temperature, for the purposes of this disclosure, and as would be appreciated by someone of ordinary skill in the art, is a measure of the heat energy of a system. Temperature, as measured by any number or combinations of sensors present within sensor 112, may be measured in Fahrenheit (° F.), Celsius (° C.), Kelvin (° K), or another scale alone or in combination. The temperature measured by sensors may comprise electrical signals, which are transmitted to their appropriate destination wireless or through a wired connection. Sensor 112 may include a multimeter configured to detect electrical properties of motor 104 and/or circuitry electrically connected to the motor 104. Multimeter may be configured to measure voltage across motor 104 or its component, electrical current through motor 104 or its component, and resistance of motor 104 or its component. Multimeter may include separate sensors to measure each of the previously disclosed electrical characteristics such as voltmeter, ammeter, and ohmmeter, respectively. Sensor 112 may include a sensor or plurality thereof that may detect voltage such as a voltage at terminals of motor 104; detection may be performed using any suitable component, set of components, and/or mechanism for direct or indirect measurement and/or detection of voltage levels, including without limitation comparators, analog to digital converters, any form of voltmeter, or the like. Sensor 112 may include digital sensors, analog sensors, or a combination thereof. Sensor 112 may include digital-to-analog converters (DAC), analog-to-digital converters (ADC, A/D, A-to-D), a combination thereof, or other signal conditioning components used in transmission of a battery sensor signal to a destination over wireless or wired connection.

In some embodiments, a plurality of data may be detected from an environment of motor 104. A plurality of data may include, but is not limited to, airborne particles, weather, temperature, air quality, and the like. In some embodiments, airborne particles may include hydrogen gas and/or any gas that may affect the performance of motor 104. Sensor 112 may detect a plurality of data about a power source of electric vehicle 108. Sensor 112 may include a plurality of voltmeters or a mixture of voltmeters and thermocouples.

Still referring to FIG. 1, sensor 112 may include a current sensor and a voltage sensor that detects a current value and a voltage value, respectively, of motor 104 and circuitry electrically connected to the motor 104. The current sensors may measure ripple current, current along the quadrature axis of a rotor included in motor 104, and current along the direct axis of the rotor. As used in this disclosure, "ripple current" is the AC current that passes through a capacitor in a circuit; ripple current is characterized by a periodic non-sinusoidal waveform. As used in this disclosure, "direct axis of a rotor," also known as d-axis, is an axis along an axis of a rotor pole. As used in this disclosure, "quadrature axis of a rotor," also known as q-axis, is an axis perpendicular to an axis of a rotor pole. A sensor may transmit a signal that includes any signal form described in this disclosure, for example digital, analog, optical, electrical, fluidic, and the like. In some cases, a sensor, a circuit, and/or a computing device may perform one or more signal processing steps on a signal. For instance, sensor 112, circuit, and/or a computing device may analyze, modify, and/or synthesize a signal in order to improve the signal, for instance by improving transmission, storage efficiency, or signal to noise ratio.

Exemplary methods of signal processing may include analog, continuous time, discrete, digital, nonlinear, and statistical. Analog signal processing may be performed on non-digitized or analog signals. Exemplary analog processes may include passive filters, active filters, additive mixers, integrators, delay lines, compandors, multipliers, voltage-controlled filters, voltage-controlled oscillators, and phase-locked loops. Continuous-time signal processing may be used, in some cases, to process signals which varying continuously within a domain, for instance time. Exemplary non-limiting continuous time processes may include time domain processing, frequency domain processing (Fourier transform), and complex frequency domain processing. Discrete time signal processing may be used when a signal is sampled non-continuously or at discrete time intervals (i.e., quantized in time). Analog discrete-time signal processing may process a signal using the following exemplary circuits sample and hold circuits, analog time-division multiplexers, analog delay lines and analog feedback shift registers. Digital signal processing may be used to process digitized discrete-time sampled signals. Commonly, digital signal processing may be performed by a computing device or other specialized digital circuits, such as without limitation an application specific integrated circuit (ASIC), a field-programmable gate array (FPGA), or a specialized digital signal processor (DSP). Digital signal processing may be used to perform any combination of typical arithmetical operations, including fixed-point and floating-point, real-valued, and complex-valued, multiplication and addition. Digital signal processing may additionally operate circular buffers and lookup tables. Further non-limiting examples of algorithms that may be performed according to digital signal processing techniques include fast Fourier transform (FFT), finite impulse response (FIR) filter, infinite impulse response (IIR) filter, and adaptive filters such as the Wiener and Kalman filters. Statistical signal processing may be used to process a signal as a random function (i.e., a stochastic process), utilizing statistical properties. For instance, in some embodiments, a signal may be modeled with a probability distribution indicating noise, which then may be used to reduce noise in a processed signal.

Still referring to FIG. 1, sensor 112 may be positioned on an exterior surface of motor 104, within the motor 104, and remote from the motor 104. For example, one or more infrared sensors may be positioned remote from motor 104 and directed toward the motor 104 to measure the infrared energy of the motor 104 to calculate the temperature of the motor 104. Sensor 112 may include a first sensor 112 and a second sensor 112, wherein the first sensor 112 is configured to detect a first set of at least a motor metric 116 and the second sensor 112 is configured to detect a second set of at least a motor metric 116 distinct from the first set of at least a motor metric 116. System 100 may include a sensor suite discussed below.

In some embodiments, sensor 112 includes sensors configured to detect state metrics and generate a measured state datum, such as geographical datum. As used in this disclosure, "state metrics" refers to the state of an electric vehicle and may include actual motion, forces, moments, and torques acting an electric vehicle; physical position and/or orientation of an electric vehicle such as the geolocation, pitch, yaw, and roll; a velocity and throttle of an electric vehicle; and environmental phenomenon in the real world such as weather conditions around an electric vehicle. A "measured state datum," for the purposes of this disclosure, is one or more elements of data representing state metrics. For example, and without limitation, measure state datum may include a current velocity of electric vehicle 108. As used in this disclosure, "throttle" refers to electric vehicle 108 outputting an amount of thrust from, for example, a propulsor. Sensor 112 may include weather sensors to detect current weather conditions. Weather sensors may be consistent with disclosure of weather sensors in U.S. patent application Ser. No. 17/515,420 filed on Oct. 30, 2021 and titled "SYSTEMS AND METHODS FOR WIND COMPENSATION OF AN ELECTRIC AIRCRAFT FIELD OF THE INVENTION", which is incorporated by reference herein in its entirety.

With continued reference to FIG. 1, system 100 also includes an augmented reality display 124 configured to display a visual representation 128 of motor datum 120. System 100 may include a graphical user interface (GUI) displayed on augmented reality display 124. As used in this disclosure, an "augmented reality" display is a display that permits a user to view a typical field of vision of the user and superimposes virtual images on the field of vision. As an example, and without limitation, GUI may be displayed on any electronic device, as described herein, such as, without limitation, a computer, tablet, remote device, and/or any other visual display device. Augmented reality display 124 may make use of reflective waveguides, diffractive waveguides, lenses, or the like to transmit, project, and/or display images. Augmented reality display 124 may include a view window, defined for the purposes of this disclosure as a portion of the augmented reality device that admits a view of field of vision; view window may include a transparent window, such as a transparent portion of goggles such as lenses or the like. Alternatively, view window may include a screen that displays field of vision to user. Augmented reality display 124 may include a projection device, defined as a device that inserts images into field of vision. Where view window is a screen, projection device may include a software and/or hardware component that adds inserted images into a display signal to be rendered on augmented reality display 124. Augmented reality display 124 may include a liquid crystal display (LCD) and/or one or more projected lasers. Augmented reality display 124 may include a heads-up display (HUD). Augmented reality display 124 may be positioned in or near the line of vision of an operator of electric vehicle 108 to allow the operator to view visual representation 128 while maintaining vision necessary for safe operation of the electric vehicle 108. In some embodiments, augmented reality display 124 may display images on one or more transparent surfaces. One or more transparent surfaces may be windows of electric vehicle 108, such as cockpit windows, or other transparent surfaces. In some embodiments, augmented reality display 124 may include an augmented reality headset. For instance, and without limitation, augmented reality display 124 may project images through and/or reflect images off an eyeglass-like structure and/or lens piece, where either both field of vision and images may be so displayed, or the former may be permitted to pass through a transparent surface. Augmented reality display 124 may be incorporated in a contact lens or eye tap device, which may introduce images into light entering an eye to cause display of such images. Augmented reality display 124 may display some images using a virtual retina display (VRD), which may display an image directly on a retina of a user.

Still referring to FIG. 1, augmented reality display 124 may implement a stereoscopic display. A "stereoscopic display," as used in this disclosure, is a display that simulates a user experience of viewing a three-dimensional space and/or object, for instance by simulating and/or replicating different perspectives of a user's two eyes; this is in contrast to a two-dimensional image, in which images presented to each eye are substantially identical, such as may occur when viewing a flat screen display. Stereoscopic display may display two flat images having different perspectives, each to only one eye, which may simulate the appearance of an object or space as seen from the perspective of that eye. Alternatively or additionally, stereoscopic display may include a three-dimensional display such as a holographic display or the like. Persons skilled in the art, upon reviewing the entirety of this disclosure, will be aware of various alternative or additional types of stereoscopic display that may be employed in an augmented reality device. In some embodiments, augmented reality display 124 includes a touch screen to receive input from a user.

With continued reference to FIG. 1, visual representation 128 of motor datum 120 may be one or more images that communicate motor datum 120. Visual representation 128 may include pictorial images, symbolic images, numerical images, or a combination thereof. Visual representation 128 may include multi-colored images. Visual representation 128 may include an alert. Alert may be a general notification of the current status of motor 104 or a component of the motor 104, such as a general alert for the motor 104 or a component of the motor 104. Alert may be a categorized notification, such as an alert that motor 104 is overheating. Alert may include a specific notification, such as an alert that motor 104 has reached a specific temperature. Visual representation 128 may include a heat map of motor 104. Augmented reality display 124 may be configured to overlay visual representation 128 onto motor 104. For example, augmented reality display 124 may be configured to overlay visual representation 128 of the heat map onto motor 104. For example, augmented reality display 124, including a transparent screen, and/or a computing device communicatively connected to the augmented reality display 124 may be configured to identify motor 104 that is positioned in a user's line of vision through transparent screen and resize and position heat map of motor 104 onto transparent screen such that it appears by user to be overlaid onto the motor 104, thus displaying the temperature of motor 104 on its corresponding location. In some embodiments, augmented reality display 124 may be configured to display a virtual image of motor 104 and overlay visual representation 128 of the heat map onto the virtual image of the motor 104. The virtual image of motor 104 may be a three-dimensional image of the motor 104. The image of motor 104 may be manipulated by a user to alter the viewing angle, such as rotating the image of the motor 104 to observe all sides of the motor 104. An advantage, for example, is that user can readily identify the location of issues, such as where an excessive amount of heat caused by friction is originating on the motor 104.

Still referring to FIG. 1, system 100 further includes a computing device 132 communicatively connected to sensor 112 and augmented reality display 124. Computing device 132 is configured to receive motor datum 120 from sensor 112 and command augmented reality display 124 to display visual representation 128 of motor datum 120. Computing device 132 may identify a flight maneuver performed by electric vehicle 108. As used in this disclosure, "flight maneuver" is a movement or series of moves performed by an aircraft during commencement, operation, and/or termination of flight. A flight maneuver may include takeoff, landing, stability control maneuvers, emergency response maneuvers, regulation of altitude, roll, pitch, yaw, speed, acceleration, or the like during any phase of flight. A flight maneuver may include a flight plan or sequence of maneuvers to be performed during a flight plan. Computing device 132 may be configured to aggregate motor datum 120 into a data structure. Computing device 132 may be configured to organize motor datum 120. Computing device 132 may be configured to process and/or analyze at least a motor metric 116 as represented in motor datum 120. In some embodiments, computing device 132 may store a log of motor datum 120 detailing performance at least a motor metric 116 from previous operation and compare motor datum 120 received in real time by sensor 112 to corresponding motor datum 120 from one or more previously logged operations of motor 104 in a similar environment and during a similar function. In some embodiments, computer device may also analyze state datum. For example, sensor 112 in real time may collect motor datum 120 identifying that electric aircraft is performing a takeoff and measuring the rate of ascent, the temperature of motor 104, and the environmental temperature. Computing device 132 may then compare the real time temperature of motor 104 to the temperature of motor 104 from previously logged operations of the motor 104 while performing a takeoff with a similar rate of ascent in a similar environmental temperature. In some embodiments, previously logged operations may include operations of other motors of the same type as motor 104 that are in the same type of electric vehicle, thereby expanding the database for comparisons and allowing computing device 132 to identify whether motor 104 is operating consistently but still irregularly compared to other motors of the same type.

With continued reference to FIG. 1, computing may be further configured to train a state machine-learning model and/or a neural network using operating state training data, where the operating state training data comprising a plurality of inputs containing compatibility elements correlated with a plurality of outputs containing operating state elements and generate the operating state as a function of the operating state machine-learning model. A "neural network," as used in this disclosure, is a computer system modeled on the human brain and nervous system for solving artificial intelligence problems and comprises artificial neurons and nodes. Computing device 132 may be configured to receive an input, such as a user input, regarding information of various types of electric vehicle and/or types of motor. Computing device 132 may be configured to receive input of motor datum 120 and output a diagnostic data element. Each operating state element may include a diagnostic data element. Computing device 132 may retrieve a plurality of distinct motor data from an electric vehicle database stored in, for example, a memory of computing device 132 or another computing device. Past motor datum 120 and corresponding past diagnostic data may be inputted into state machine-learning model and/or a neural network configured to output a data diagnostic element. A first set of motor data and a second set of motor data distinct from the first set of motor data may be inputted into state machine-learning model and/or neural network with their corresponding diagnostic data. A log of motor datum 120 may be inputted into state machine-learning model and/or neural network. Examples of past motor data and their corresponding past diagnostic data include data from past flights. By inputting a plurality of distinct motor data, state machine-learning model and/or neural network may be trained by correlating the examples of past motor data to past diagnostic data entered by a user.

Still referring to FIG. 1, past motor data may include a first set of motor data and a second set of motor data distinct from first set of motor data. For example, first set of motor data may include temperature data of motor 104 and second set of motor data may include sound data of the motor 104. From the training, computing device 132 may learn instances of possible correlation between multiple sets of data based on at least a motor metric 116 at a given time to further develop output diagnostic data. In some cases, computing device 132 may allow for verification that motor 104 is functional and operating properly. As used in this disclosure, "verification" is a process of ensuring that which is being "verified" complies with certain constraints, for example without limitation system requirements, regulations, and the like. In some cases, verification may include comparing a product, such as without limitation performance metrics of motor 104, against one or more acceptance criteria. For example, in some cases, motor 104 may be required to function according to prescribed constraints or specification. Ensuring that performance at least a motor metric 116 are in compliance with acceptance criteria may, in some cases, constitute verification. In some cases, verification may include ensuring that data (e.g., performance metric data) is complete, for example that all required data types, are present, readable, uncorrupted, and/or otherwise useful for computing device 132. In some cases, some or all verification processes may be performed by computing device 132. In some cases, at least a machine-learning process, for example a machine-learning model, may be used to verify. Computing device 132 may use any machine-learning process described in this disclosure for this or any other function. In some embodiments, at least one of validation and/or verification includes without limitation one or more of supervisory validation, machine-learning processes, graph-based validation, geometry-based validation, and rules-based validation.

With continued reference to FIG. 1, computing device 132 may be configured to control the display of motor datum 120 on augmented reality display 124. Computing device 132 may include controls for a user to input commands and/or be communicatively connected to controls. According to input received from controls, computing device 132 may be configured to, for example, cycle through different motor datum 120 displayed on augmented reality display 124, select motor datum 120 for further information regarding that motor datum 120 to be displayed on the augmented reality display 124, and/or compare the current motor datum 120 to acceptable parameters of motor 104 to determine the overall health of the motor 104. Computing device 132 may be configured to display output diagnostic data on augmented reality display 124. Display may include identification of input motor data that influenced output diagnostic data. For example, augmented reality display 124 may display output diagnostic data indicating that there are high levels of friction between moving components of motor 104 and may also identify the influencing input data of high levels of noise and temperature from an area on the motor 104. Computing device 132 may be configured to display on augmented reality display 124 first set of motor data and second set of motor data.

Still referring to FIG. 1, computing device 132 may include any computing device as described in this disclosure, including without limitation a microcontroller, microprocessor, digital signal processor (DSP) and/or system on a chip (SoC) as described in this disclosure. Computing device 132 may include, be included in, and/or communicate with a mobile device such as a mobile telephone or smartphone. Computing device 132 may include a single computing device operating independently, or may include two or more computing device operating in concert, in parallel, sequentially or the like; two or more computing devices may be included together in a single computing device or in two or more computing devices. Computing device 132 may interface or communicate with one or more additional devices as described below in further detail via a network interface device. Network interface device may be utilized for connecting computing device 132 to one or more of a variety of networks, and one or more devices. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network may employ a wired and/or a wireless mode of communication. In general, any network topology may be used. Information (e.g., data, software etc.) may be communicated to and/or from a computer and/or a computing device. Computing device 132 may include but is not limited to, for example, a computing device or cluster of computing devices in a first location and a second computing device or cluster of computing devices in a second location. Computing device 132 may include one or more computing devices dedicated to data storage, security, distribution of traffic for load balancing, and the like. Computing device 132 may distribute one or more computing tasks as described below across a plurality of computing devices of computing device, which may operate in parallel, in series, redundantly, or in any other manner used for distribution of tasks or memory between computing devices. Computing device 132 may be implemented using a "shared nothing" architecture in which data is cached at the worker, in an embodiment, this may enable scalability of system 100 and/or computing device 132.

With continued reference to FIG. 1, computing device 132 may be designed and/or configured to perform any method, method step, or sequence of method steps in any embodiment described in this disclosure, in any order and with any degree of repetition. For instance, computing device 132 may be configured to perform a single step or sequence repeatedly until a desired or commanded outcome is achieved; repetition of a step or a sequence of steps may be performed iteratively and/or recursively using outputs of previous repetitions as inputs to subsequent repetitions, aggregating inputs and/or outputs of repetitions to produce an aggregate result, reduction or decrement of one or more variables such as global variables, and/or division of a larger processing task into a set of iteratively addressed smaller processing tasks. Computing device 132 may perform any step or sequence of steps as described in this disclosure in parallel, such as simultaneously and/or substantially simultaneously performing a step two or more times using two or more parallel threads, processor cores, or the like; division of tasks between parallel threads and/or processes may be performed according to any protocol suitable for division of tasks between iterations. Persons skilled in the art, upon reviewing the entirety of this disclosure, will be aware of various ways in which steps, sequences of steps, processing tasks, and/or data may be subdivided, shared, or otherwise dealt with using iteration, recursion, and/or parallel processing.

Figure 2:
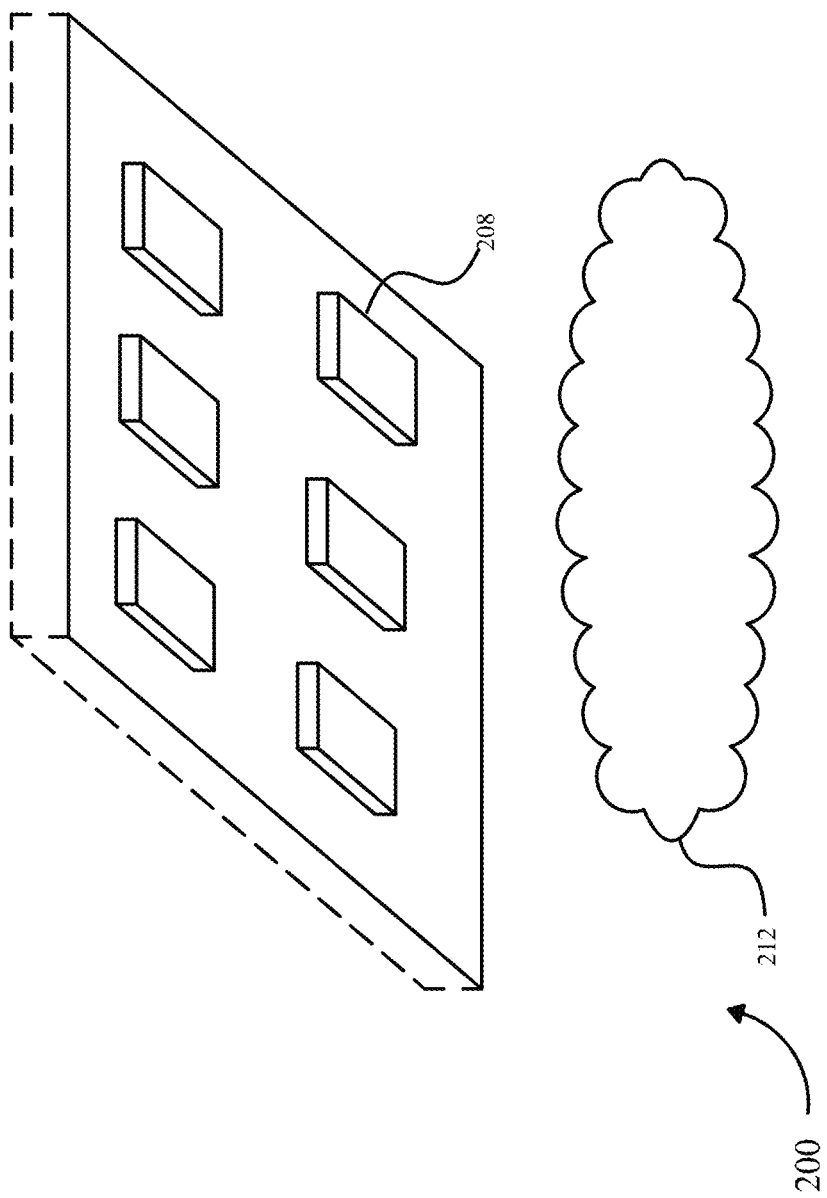
FIG. 2 is a schematic drawing of an exemplary sensor suite according to an embodiment of the disclosure.

Referring now to FIG. 2, an exemplary embodiment of sensor suite 200 is presented. Sensor suite 200 may include a plurality of independent sensors 112, as described herein, where any number of the described sensors may be used to detect any number of physical or electrical quantities associated with motor 104 and environmental conditions, one or more circuits and/or circuit elements, including, for example, a printed circuit board component. Circuit may include any analog or digital control circuit, including without limitation a combinational and/or synchronous logic circuit, a processor, microprocessor, microcontroller, or the like. In some embodiments, sensor suite 200 may communicate by way of at least a conductor, such as within limitation a control signal conductor. Alternatively and/or additionally, in some cases, sensor suite 200 may be communicative by at least a network, for example any network described in this disclosure including wireless (Wi-Fi), controller area network (CAN), the Internet, and the like. System 100 may include a plurality of sensors in the form of individual sensors or a sensor suite working in tandem or individually. Independent sensors 112 may include separate sensors measuring physical or electrical quantities that may be powered by and/or in communication with circuits independently, where each may signal sensor output to computing device. In an embodiment, use of a plurality of independent sensors may result in redundancy configured to employ more than one sensor that measures the same phenomenon, those sensors being of the same type, a combination of, or another type of sensor not disclosed, so that in the event one sensor fails, the ability to detect phenomenon is maintained.

Still referring to FIG. 2, sensor suite 200 may include a sensor configured to detect gas that may be emitted during or after a catastrophic cell failure 212. "Catastrophic cell failure", for the purposes of this disclosure, refers to a malfunction of a battery cell, which may be an electrochemical cell, that renders the cell inoperable for its designed function, namely providing electrical energy to at least a portion of an electric aircraft. Byproducts of catastrophic cell failure 212 may include gaseous discharge including oxygen, hydrogen, carbon dioxide, methane, carbon monoxide, a combination thereof, or another undisclosed gas, alone or in combination. Further the sensor configured to detect vent gas from electrochemical cells may comprise a gas detector. For the purposes of this disclosure, a "gas detector" is a device used to detect a gas is present in an area. Gas detectors, and more specifically, the gas sensor that may be used in sensor suite 200, may be configured to detect combustible, flammable, toxic, oxygen depleted, a combination thereof, or another type of gas alone or in combination. The gas sensor that may be present in sensor suite 200 may include a combustible gas, photoionization detectors, electrochemical gas sensors, ultrasonic sensors, metal-oxide-semiconductor (MOS) sensors, infrared imaging sensors, a combination thereof, or another undisclosed type of gas sensor alone or in combination. Sensor suite 200 may include sensors that are configured to detect non-gaseous byproducts of catastrophic cell failure 212 including, in non-limiting examples, liquid chemical leaks including aqueous alkaline solution, ionomer, molten phosphoric acid, liquid electrolytes with redox shuttle and ionomer, and salt water, among others. Sensor suite 200 may include sensors that are configured to detect non-gaseous byproducts of catastrophic cell failure 212 including, in non-limiting examples, electrical anomalies as detected by any of the previous disclosed sensors or components. Sensor suite 200 may be consistent with disclosure of sensor suite in U.S. patent application Ser. No. 17/405,840 filed on Aug. 18, 2021 and titled "CONNECTOR AND METHODS OF USE FOR CHARGING AN ELECTRIC VEHICLE FIELD OF THE INVENTION", which is incorporated by reference herein in its entirety.

Figure 3:
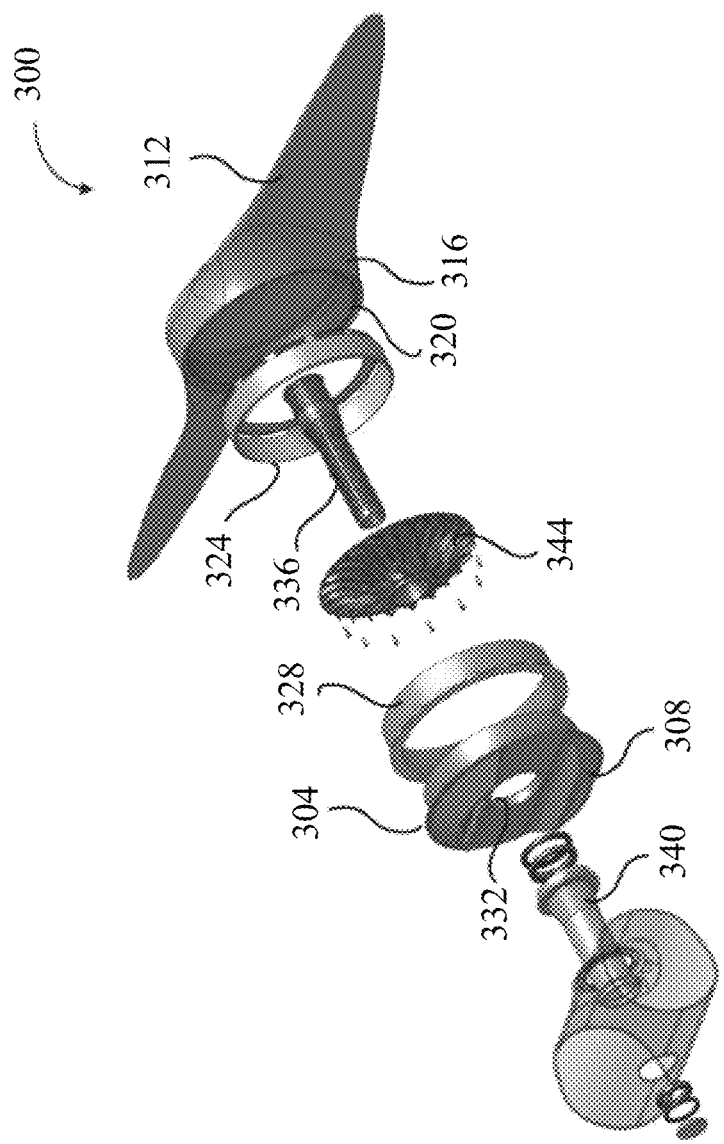
FIG. 3 is an exploded view of an exemplary motor according to an embodiment of the disclosure.

Referring now to FIG. 3, an exemplary embodiment of a motor 300 is illustrated. Motor 300 may include at least a stator 304. Stator 304, as used herein, is a stationary component of a motor and/or motor assembly. In an embodiment, stator 304 may include at least first magnetic element 308. As used herein, first magnetic element 308 is an element that generates a magnetic field. For example, first magnetic element 308 may include one or more magnets which may be assembled in rows along a structural casing component. Further, first magnetic element 308 may include one or more magnets having magnetic poles oriented in at least a first direction. The magnets may include at least a permanent magnet. Permanent magnets may be composed of, but are not limited to, ceramic, alnico, samarium cobalt, neodymium iron boron materials, any rare earth magnets, and the like. Further, the magnets may include an electromagnet. As used herein, an electromagnet is an electrical component that generates magnetic field via induction; the electromagnet may include a coil of electrically conducting material, through which an electric current flow to generate the magnetic field, also called a field coil of field winding. A coil may be wound around a magnetic core, which may include without limitation an iron core or other magnetic material. The core may include a plurality of steel rings insulated from one another and then laminated together; the steel rings may include slots in which the conducting wire will wrap around to form a coil. First magnetic element 308 may act to produce or generate a magnetic field to cause other magnetic elements to rotate, as described in further detail below. Stator 304 may include a frame to house components including first magnetic element 308, as well as one or more other elements or components as described in further detail below. In an embodiment, a magnetic field may be generated by first magnetic element 308 and can include a variable magnetic field. In embodiments, a variable magnetic field may be achieved by use of an inverter, a controller, or the like. In an embodiment, stator 304 may have an inner and outer cylindrical surface; a plurality of magnetic poles may extend outward from the outer cylindrical surface of the stator. In an embodiment, stator 304 may include an annular stator, wherein the stator is ring-shaped. In an embodiment, stator 304 is incorporated into a DC motor where stator 304 is fixed and functions to supply the magnetic fields where a corresponding rotor, as described in further detail below, rotates. In an embodiment, stator 304 may be incorporated an AC motor where stator 304 is fixed and functions to supply the magnetic fields by radio frequency electric currents through an electromagnet to a corresponding rotor, as described in further detail below, rotates.

Still referring to FIG. 3, motor 300 may include propulsor 312. In embodiments, propulsor 312 may include an integrated rotor. As used herein, a rotor is a portion of an electric motor that rotates with respect to a stator of the electric motor, such as stator 304. A propulsor, as used herein, is a component or device used to propel a craft by exerting force on a fluid medium, which may include a gaseous medium such as air or a liquid medium such as water. Propulsor 312 may be any device or component that consumes electrical power on demand to propel an aircraft or other vehicle while on ground and/or in flight. Propulsor 312 may include one or more propulsive devices. In an embodiment, propulsor 312 may include a thrust element which may be integrated into the propulsor. A thrust element may include any device or component that converts the mechanical energy of a motor, for instance in the form of rotational motion of a shaft, into thrust in a fluid medium. For example, a thrust element may include without limitation a marine propeller or screw, an impeller, a turbine, a pump-jet, a paddle or paddle-based device, or the like. As another non-limiting example, at least a propulsor may include an eight-bladed pusher propeller, such as an eight-bladed propeller mounted behind the engine to ensure the drive shaft is in compression. Persons skilled in the art, upon reviewing the entirety of this disclosure, will be aware of various devices that may be used as at least a thrust element. As used herein, a propulsive device may include, without limitation, a device using moving or rotating foils, including without limitation one or more rotors, an airscrew or propeller, a set of airscrews or propellers such as contra-rotating propellers, a moving or flapping wing, or the like. In an embodiment, propulsor 312 may include at least a blade. Persons skilled in the art, upon reviewing the entirety of this disclosure, will be aware of various devices that may be used as propulsor 312. In an embodiment, when a propulsor twists and pulls air behind it, it will, at the same time, push the aircraft forward with an equal amount of force. The more air pulled behind the aircraft, the more the aircraft is pushed forward. In an embodiment, thrust element may include a helicopter rotor incorporated into propulsor 312. A helicopter rotor, as used herein, may include one or more blade or wing elements driven in a rotary motion to drive fluid medium in a direction axial to the rotation of the blade or wing element. Its rotation is due to the interaction between the windings and magnetic fields which produces a torque around the rotor's axis. A helicopter rotor may include a plurality of blade or wing elements.

Continuing to refer to FIG. 3, in an embodiment, propulsor 312 may include hub 316 rotatably mounted to stator 304. Rotatably mounted, as described herein, is functionally secured in a manner to allow rotation. Hub 316 is a structure which allows for the mechanically coupling of components of the integrated rotor assembly. In an embodiment, hub 316 can be mechanically coupled to propellers or blades. In an embodiment, hub 316 may be cylindrical in shape such that it may be mechanically joined to other components of the rotor assembly. Hub 316 may be constructed of any suitable material or combination of materials, including without limitation metal such as aluminum, titanium, steel, or the like, polymer materials or composites, fiberglass, carbon fiber, wood, or any other suitable material. Hub 316 may move in a rotational manner driven by interaction between stator and components in the rotor assembly. Persons skilled in the art, upon reviewing the entirety of this disclosure, will be aware of various structures that may be used as or included as hub 316, as used and described herein.

Still referring to FIG. 3, in an embodiment, propulsor 312 and/or rotor shaft 336 may include second magnetic element 320, which may include one or more further magnetic elements. Second magnetic element 320 generates a magnetic field designed to interact with first magnetic element 308. Second magnetic element 320 may be designed with a material such that the magnetic poles of at least a second magnetic element are oriented in an opposite direction from first magnetic element 308. In an embodiment, second magnetic element 320 may be affixed to hub 316, rotor shaft 336, or another rotating or stationary electric motor component disclosed herein. Affixed, as described herein, is the attachment, fastening, connection, and the like, of one component to another component. For example, and without limitation, affixed may include bonding the second magnetic element 320 to hub 316, such as through hardware assembly, spot welding, riveting, brazing, soldering, glue, and the like. Second magnetic element 320 may include any magnetic element suitable for use as first magnetic element 308. For instance, and without limitation, second magnetic element may include a permanent magnet and/or an electromagnet. Second magnetic element 320 may include magnetic poles oriented in a second direction opposite, in whole or in part, of the orientation of the poles of first magnetic element 308. In an embodiment, motor 300 may include a motor assembly incorporating stator 304 with a first magnet element and second magnetic element 320. First magnetic element 308 may include magnetic poles oriented in a first direction, a second magnetic element includes a plurality of magnetic poles oriented in the opposite direction than the plurality of magnetic poles in the first magnetic element 308.

Referring again to FIG. 3, in an embodiment, first magnetic element 308 may be a productive element, defined herein as an element that produces a varying magnetic field. Productive elements may produce magnetic field that may attract and other magnetic elements, possibly including a receptive element. Second magnetic element may be a productive or receptive element. A receptive element may react due to the magnetic field of first magnetic element 308. In an embodiment, first magnetic element 308 may produce a magnetic field according to magnetic poles of first magnetic element 308 oriented in a first direction. Second magnetic element 320 may produce a magnetic field with magnetic poles in the opposite direction of the first magnetic field, which may cause the two magnetic elements to attract one another. Receptive magnetic element may be slightly larger in diameter than the productive element. Interaction of productive and receptive magnetic elements may produce torque and cause the assembly to rotate. Hub 316 and rotor assembly may both be cylindrical in shape where rotor may have a slightly smaller circumference than hub 316 to allow the joining of both structures. Coupling of hub 316 to stator 304 may be accomplished via a surface modification of either hub 316, stator 304 or both to form a locking mechanism. Coupling may be accomplished using additional nuts, bolts, and/or other fastening apparatuses. In an embodiment, an integrated rotor assembly as described above may reduce profile drag in forward flight for an electric aircraft. Profile drag may be caused by a number of external forces that the aircraft is subjected to. In an embodiment, incorporating propulsor 312 into hub 316, may reduce a profile of motor 300 resulting in a reduced profile drag. In an embodiment, the rotor, which may include motor inner magnet carrier 324, motor outer magnet carrier 328, propulsor 312 may be incorporated into hub 316. In an embodiment, inner motor magnet carrier 324 may rotate in response to a magnetic field. The rotation may cause hub 316 to rotate. This unit may be inserted into motor 300 as one unit. This may enable ease of installation, maintenance, and removal.

Still referring to FIG. 3, stator 304 may include through-hole 332. Through-hole 332 may provide an opening for a component to be inserted through to aid in attaching propulsor with integrated rotor and rotor shaft to stator. In an embodiment, through-hole 332 may have a round or cylindrical shape and be located at a rotational axis of stator 304, which in an embodiment may be similar to or the same as the axis of rotation of the propulsor 312. Hub 316 may be mounted to stator 304 by means of rotor shaft 336 rotatably inserted though through-hole 332. The rotor shaft 336 may be mechanically coupled to stator 304 such that rotor shaft 336 is free to rotate about its centerline axis, which may be effectively parallel and coincident to stator's centerline axis, and further the rotor shaft and stator may include a void of empty space between them, where at least a portion the outer cylindrical surface of the rotor shaft is not physically contacting at least a portion of the inner cylindrical surface of the stator. This void may be filled, in whole or in part, by air, a vacuum, a partial vacuum or other gas or combination of gaseous elements and/or compounds, to name a few. Through-hole 332 may have a diameter that is slightly larger than a diameter of rotor shaft 336 to allow rotor shaft 336 to fit through through-hole 332 to connect stator 304 to hub 316. Rotor shaft 336 may rotate in response to rotation of propulsor 312.

Still referring to FIG. 3, motor 300 may include a bearing cartridge 340. Bearing cartridge 340 may include a bore. Rotor shaft 336 may be inserted through the bore of bearing cartridge 340. Bearing cartridge 340 may be attached to a structural element of a vehicle. Bearing cartridge 340 functions to support the rotor and to transfer the loads from the motor. Loads may include, without limitation, weight, power, magnetic pull, pitch errors, out of balance situations, and the like. Bearing cartridge 340 may include a bore. Bearing cartridge 340 may include a smooth metal ball or roller that rolls against a smooth inner and outer metal surface. The rollers or balls take the load, allowing the device to spin. a bearing may include, without limitation, a ball bearing, a straight roller bearing, a tapered roller bearing or the like. Bearing cartridge 340 may be subject to a load which may include, without limitation, a radial or a thrust load. Depending on the location of bearing cartridge 340 in the assembly, it may see all of a radial or thrust load or a combination of both. In an embodiment, bearing cartridge 340 may join motor 300 to a structure feature. Bearing cartridge 340 may function to minimize the structural impact from the transfer of bearing loads during flight and/or to increase energy efficiency and power of propulsor. Bearing cartridge 340 may include a shaft and collar arrangement, wherein a shaft affixed into a collar assembly. A bearing element may support the two joined structures by reducing transmission of vibration from such bearings. Roller (rolling-contact) bearings are conventionally used for locating and supporting machine parts such as rotors or rotating shafts. Typically, the rolling elements of a roller bearing are balls or rollers. In general, a roller bearing is a type of anti-friction bearing; a roller bearing functions to reduce friction allowing free rotation. Also, a roller bearing may act to transfer loads between rotating and stationary members. In an embodiment, bearing cartridge 340 may act to keep propulsor 312 and components intact during flight by allowing motor 300 to rotate freely while resisting loads such as an axial force. In an embodiment, bearing cartridge 340 may include a roller bearing incorporated into the bore. A roller bearing is in contact with rotor shaft 336. Stator 304 may be mechanically coupled to inverter housing. Mechanically coupled may include a mechanical fastening, without limitation, such as nuts, bolts or other fastening device. Mechanically coupled may include welding or casting or the like. Inverter housing may contain a bore which allows insertion by rotor shaft 336 into bearing cartridge 340.

Still referring to FIG. 3, motor 300 may include a motor assembly incorporating a rotating assembly and a stationary assembly. Hub 316, motor inner magnet carrier 324 and rotor shaft 336 may be incorporated into the rotor assembly of motor 300 which make up rotating parts of electric motor, moving between the stator poles and transmitting the motor power. As one integrated part, the rotor assembly may be inserted and removed in one piece. Stator 304 may be incorporated into the stationary part of the motor assembly. Stator and rotor may combine to form an electric motor. In embodiment, an electric motor may, for instance, incorporate coils of wire, which may be similar to or the same as any of the electrically conductive components in the entirety of this disclosure, which are driven by the magnetic force exerted by a first magnetic field on an electric current. The function of the motor may be to convert electrical energy into mechanical energy. In operation, a wire carrying current may create at least a first magnetic field with magnetic poles in a first orientation which interacts with a second magnetic field with magnetic poles oriented in the opposite direction of the first magnetic pole direction causing a force that may move a rotor in a direction. For example, and without limitation, first magnetic element 308 in motor 300 may include an active magnet. For instance, and without limitation, a second magnetic element may include a passive magnet, a magnet that reacts to a magnetic force generated by first magnetic element 308. In an embodiment, a first magnet positioned around the rotor assembly, may generate magnetic fields to affect the position of the rotor relative to the stator 304. A controller may have an ability to adjust electricity originating from a power supply and, thereby, the magnetic forces generated, to ensure stable rotation of the rotor, independent of the forces induced by the machinery process.

Motor 300 may include impeller 344, coupled with the rotor shaft 336. An impeller, as described herein, is a rotor used to increase or decrease the pressure and flow of a fluid, including at least air. Impeller 344 may function to provide cooling to motor 300. Impeller 344 may include varying blade configurations, such as radial blades, non-radial blades, semi-circular blades, and airfoil blades. Impeller 344 may further include single and/or double-sided configurations. Impeller 344 is described in further detail below. Additionally, or alternatively, in a non-limiting illustrative example, rotor shaft 336 may be mechanically coupled to cooling vanes. Cooling vanes are used to lower the temperature of a high-velocity mechanical part, like the rotor in an electrical motor. Cooling vanes may employ a plurality of physical principles to cool mechanical parts. Cooling vanes may draw cool air like a fan if mechanically coupled to the rotor at an angle sufficient to create a pressure differential in order to draw cool air from outside the motor housing into the relatively hot inner motor and cool internal mechanical parts by convection. The cooling vanes may alternatively, or additionally cool other components disclosed herein with the impeller. Convection cooling in principle, is cooling of a portion of a body by moving a fluid over it, the tendency of heat energy to move from high to low energy areas, like a hot spinning rotor to cool moving air. Additionally, cooling vanes may act as thermodynamic fins. Heat energy may be conducted through the cooling vanes from the hot rotor shaft to the tips of the cooling vanes, thus dissipating heat in a high-speed rotating part. Cooling vanes may be consistent with those disclosed in U.S. patent application Ser. No. 16/910,255 entitled "Integrated Electric Propulsion Assembly" and incorporated herein by reference in its entirety.

Figure 4:
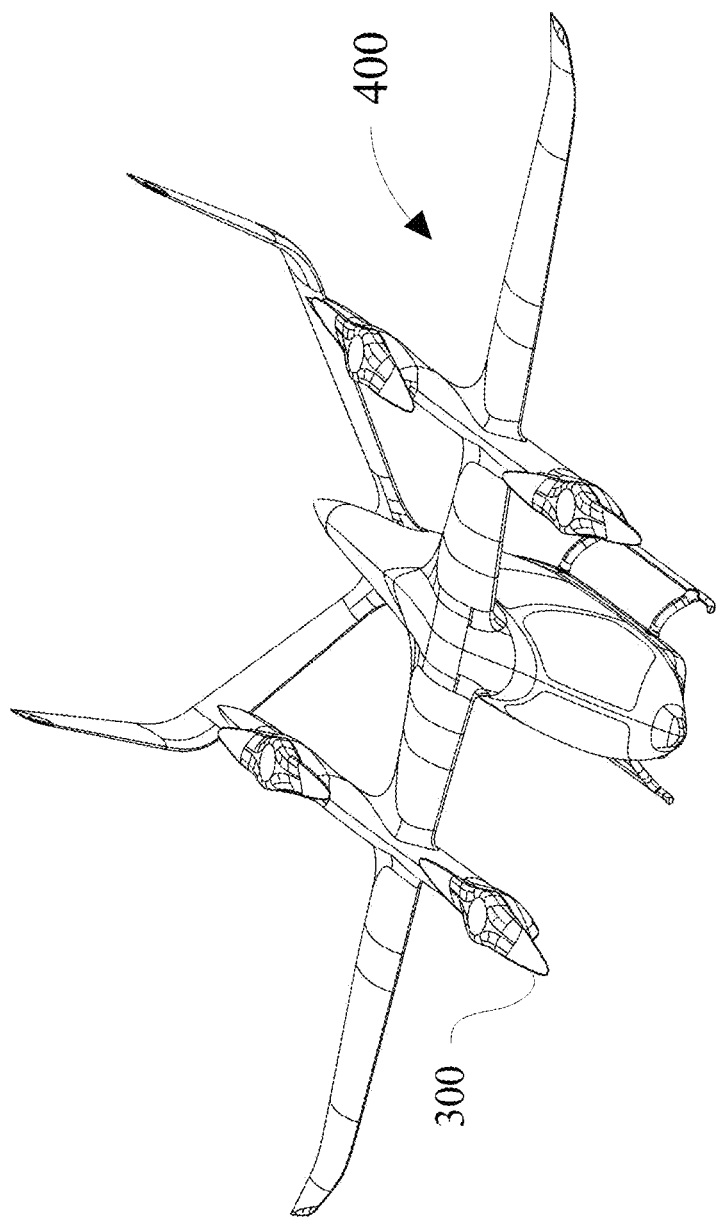
FIG. 4 is a perspective view of a motor incorporated in an electric aircraft according to an embodiment of the disclosure.

Now referring to FIG. 4, an exemplary embodiment of an electric aircraft 400 is illustrated. Electric aircraft 400 may include motor 300 may be mounted on a structural feature of an aircraft. Design of motor 300 may enable it to be installed external to the structural member (such as a boom, nacelle, or fuselage) for easy maintenance access and to minimize accessibility requirements for the structure. This may improve structural efficiency by requiring fewer large holes in the mounting area. This design may include two main holes in the top and bottom of the mounting area to access bearing cartridge. Further, a structural feature may include a component of electric aircraft 400. For example, and without limitation structural feature may be any portion of a vehicle incorporating motor 300, including any vehicle as described below. As a further non-limiting example, a structural feature may include without limitation a wing, a spar, an outrigger, a fuselage, or any portion thereof; persons skilled in the art, upon reviewing the entirety of this disclosure, will be aware of many possible features that may function as at least a structural feature. At least a structural feature may be constructed of any suitable material or combination of materials, including without limitation metal such as aluminum, titanium, steel, or the like, polymer materials or composites, fiberglass, carbon fiber, wood, or any other suitable material. As a non-limiting example, at least a structural feature may be constructed from additively manufactured polymer material with a carbon fiber exterior; aluminum parts or other elements may be enclosed for structural strength, or for purposes of supporting, for instance, vibration, torque, or shear stresses imposed by at least propulsor 312. Persons skilled in the art, upon reviewing the entirety of this disclosure, will be aware of various materials, combinations of materials, and/or constructions techniques.

Still referring to FIG. 4, electric aircraft 400 may include a vertical takeoff and landing aircraft (eVTOL). As used herein, a vertical take-off and landing (eVTOL) aircraft is one that can hover, take off, and land vertically. An eVTOL, as used herein, is an electrically powered aircraft typically using an energy source, of a plurality of energy sources to power the aircraft. In order to optimize the power and energy necessary to propel the aircraft. eVTOL may be capable of rotor-based cruising flight, rotor-based takeoff, rotor-based landing, fixed-wing cruising flight, airplane-style takeoff, airplane-style landing, and/or any combination thereof. Rotor-based flight, as described herein, is where the aircraft generated lift and propulsion by way of one or more powered rotors coupled with an engine, such as a "quad copter," multi-rotor helicopter, or other vehicle that maintains its lift primarily using downward thrusting propulsors. Fixed-wing flight, as described herein, is where the aircraft is capable of flight using wings and/or foils that generate life caused by the aircraft's forward airspeed and the shape of the wings and/or foils, such as airplane-style flight.

With continued reference to FIG. 4, a number of aerodynamic forces may act upon the electric aircraft 400 during flight. Forces acting on electric aircraft 400 during flight may include, without limitation, thrust, the forward force produced by the rotating element of the electric aircraft 400 and acts parallel to the longitudinal axis. Another force acting upon electric aircraft 400 may be, without limitation, drag, which may be defined as a rearward retarding force which is caused by disruption of airflow by any protruding surface of the electric aircraft 400 such as, without limitation, the wing, rotor, and fuselage. Drag may oppose thrust and acts rearward parallel to the relative wind. A further force acting upon electric aircraft 400 may include, without limitation, weight, which may include a combined load of the electric aircraft 400 itself, crew, baggage, and/or fuel. Weight may pull electric aircraft 400 downward due to the force of gravity. An additional force acting on electric aircraft 400 may include, without limitation, lift, which may act to oppose the downward force of weight and may be produced by the dynamic effect of air acting on the airfoil and/or downward thrust from the propulsor 312 of the electric aircraft. Lift generated by the airfoil may depend on speed of airflow, density of air, total area of an airfoil and/or segment thereof, and/or an angle of attack between air and the airfoil. For example, and without limitation, electric aircraft 400 are designed to be as lightweight as possible. Reducing the weight of the aircraft and designing to reduce the number of components is essential to optimize the weight. To save energy, it may be useful to reduce weight of components of electric aircraft 400, including without limitation propulsors and/or propulsion assemblies. In an embodiment, motor 300 may eliminate need for many external structural features that otherwise might be needed to join one component to another component. Motor 300 may also increase energy efficiency by enabling a lower physical propulsor profile, reducing drag and/or wind resistance. This may also increase durability by lessening the extent to which drag and/or wind resistance add to forces acting on electric aircraft 400 and/or propulsors.

Still referring to FIG. 4, electric aircraft 400 can include motor 300. Motor 300 may include a stator which has a first magnetic generating element generating a first magnetic field. Motor 300 may also include propulsor 312 with an integrated rotor assembly of the motor assembly which may include includes a hub mounted to stator, at least a second magnetic element generating a second magnetic field. First magnetic field and second magnetic field vary with respect to time which generates a magnetic force between both causing the rotor assembly to rotate with respect to the stator.

Figure 5:
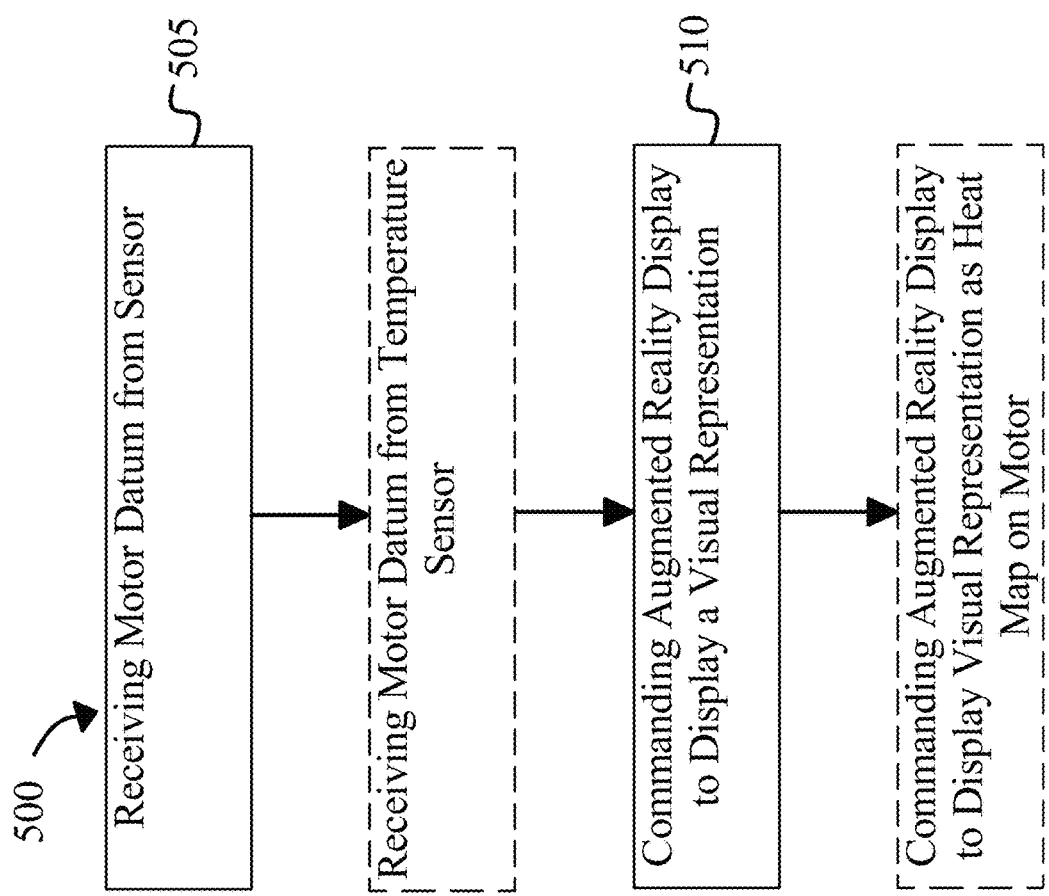
FIG. 5 is a block diagram of illustrating an exemplary embodiment of a method for monitoring the health of a motor.

Referring now to FIG. 5, an exemplary embodiment of a method 500 for monitoring health of a motor is illustrated. At step 505, computing device, communicatively connected to at least one sensor configured to detect motor datum, receives motor datum from sensor; this may be implemented, without limitation, as described above in reference to FIGS. 1-5. Sensor may include a temperature sensor. Sensor may include an infrared sensor. Sensor may include a first sensor and a second sensor, wherein first sensor is configured to detect a first set of motor data and second sensor is configured to detect a second set of motor data distinct from first set of motor data. Sensor may include a current sensor configured to measure a ripple current. Sensor may include a current sensor configured to measure a current along a direct axis of motor. Sensor may include a current sensor configured to measure a current along a quadrature axis of motor.

At step 510, computing device, communicatively connected to an augmented reality display, commands augmented reality display to display a visual representation of motor datum; this may be implemented, without limitation, as described above in reference to FIGS. 1-5. Visual representation may include a heat map of motor. Augmented reality display may be configured to overlay visual representation of heat map onto motor. Augmented reality display may include a heads-up display. Augmented reality display may include an augmented reality headset.

Figure 6:
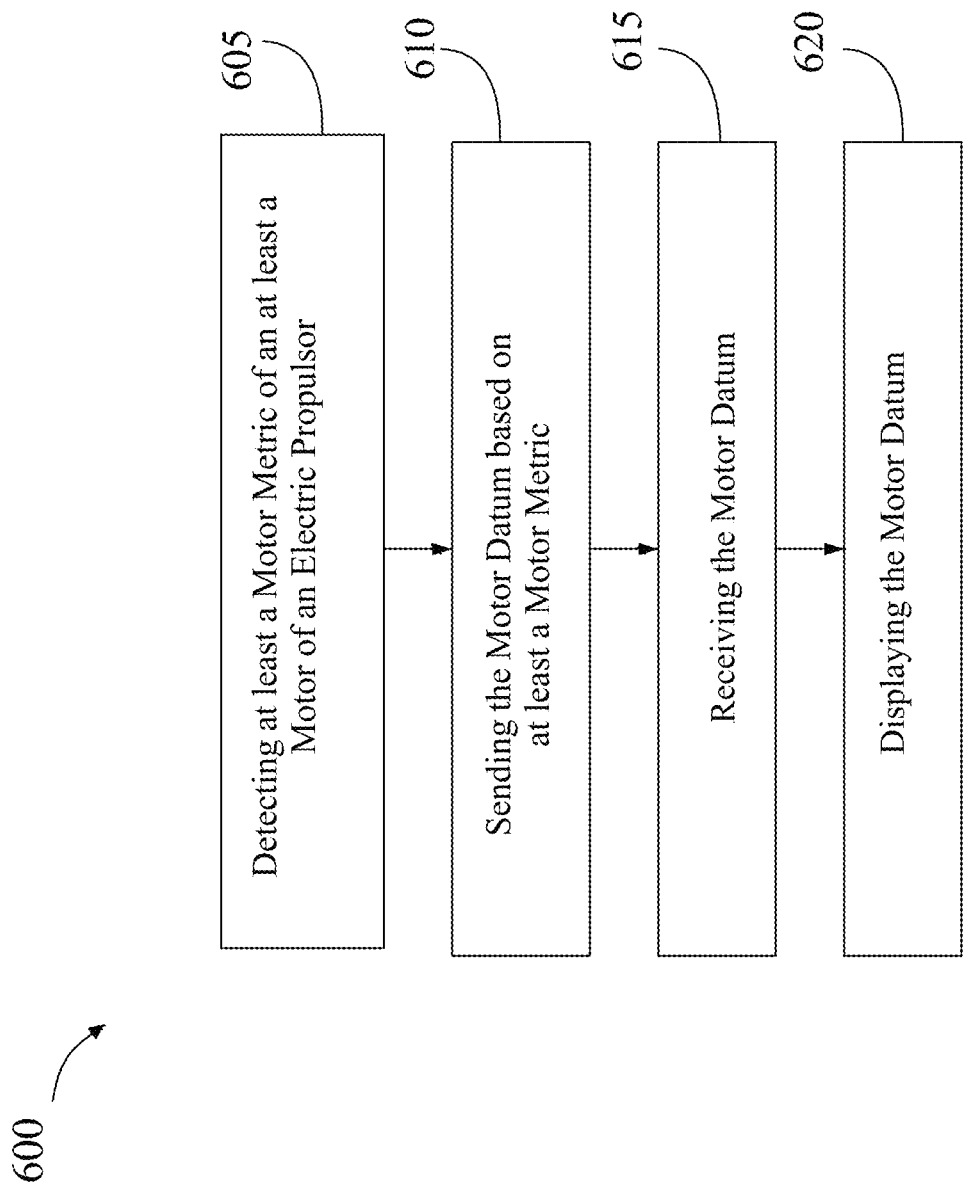
FIG. 6 is a block diagram of illustrating an exemplary embodiment of another method for monitoring the health of a motor.

Referring now to FIG. 6, an exemplary embodiment of a method 600 for monitoring the health of a motor is illustrated. Method 600 includes a step 605 of detecting, using at least a sensor, at least a motor metric of at least a motor of at least an electric propulsor. This may be implemented, without limitation, as disclosed with reference to FIGS. 1-5. In some embodiments, at least a sensor may comprise a first sensor and a second sensor, wherein the first sensor is configured to detect a first set of motor data and the second sensor is configured to detect a second set of motor data distinct from the first set of motor data. In another embodiment, at least a senor may be configured to detect a vibration datum, voltage, current, and/or an output torque datum. This may be implemented, without limitation, as disclosed with reference to FIGS. 1-5. In some embodiments, at least a sensor may comprise a current sensor configured to measure a ripple current. In some embodiments, at least a sensor may comprise a current sensor configured to measure current. In some embodiments, at least a sensor a current sensor may be configured to measure a current along a direct axis. In some embodiments, at least a sensor may also comprise a current sensor configured to measure a current along a quadrature axis Still referring to FIG. 6, method 600 includes a step 610 of sending, by the at least a sensor, a motor datum based on the at least a motor metric. This may be implemented, without limitation, as disclosed with reference to FIGS. 1-5. Method 600 includes a step 615 of receiving, at the computing device, the motor datum. This may be implemented, without limitation, as disclosed with reference to FIGS. 1-5.

Still referring to FIG. 6, method 600 includes a step 620 of displaying, by the computing device, the motor datum. This may be implemented, without limitation, as disclosed with reference to FIGS. 1-5. In some embodiments, step 620 may include displaying a visual representation of the motor datum. This may be implemented, without limitation, as disclosed with reference to FIGS. 1-5. In an embodiment, at least a senor may comprise a temperature sensor. In some embodiments, the visual representation may include a heat map of the motor. In some embodiments, the temperature sensor may comprise an infrared sensor.

It is to be noted that any one or more of the aspects and embodiments described herein may be conveniently implemented using one or more machines (e.g., one or more computing devices that are utilized as a user computing device for an electronic document, one or more server devices, such as a document server, etc.) programmed according to the teachings of the present specification, as will be apparent to those of ordinary skill in the computer art. Appropriate software coding can readily be prepared by skilled programmers based on the teachings of the present disclosure, as will be apparent to those of ordinary skill in the software art. Aspects and implementations discussed above employing software and/or software modules may also include appropriate hardware for assisting in the implementation of the machine executable instructions of the software and/or software module.

Such software may be a computer program product that employs a machine-readable storage medium. A machine-readable storage medium may be any medium that is capable of storing and/or encoding a sequence of instructions for execution by a machine (e.g., a computing device) and that causes the machine to perform any one of the methodologies and/or embodiments described herein. Examples of a machine-readable storage medium include, but are not limited to, a magnetic disk, an optical disc (e.g., CD, CD-R, DVD, DVD-R, etc.), a magneto-optical disk, a read-only memory "ROM" device, a random access memory "RAM" device, a magnetic card, an optical card, a solid-state memory device, an EPROM, an EEPROM, and any combinations thereof. A machine-readable medium, as used herein, is intended to include a single medium as well as a collection of physically separate media, such as, for example, a collection of compact discs or one or more hard disk drives in combination with a computer memory. As used herein, a machine-readable storage medium does not include transitory forms of signal transmission.

Such software may also include information (e.g., data) carried as a data signal on a data carrier, such as a carrier wave. For example, machine-executable information may be included as a data-carrying signal embodied in a data carrier in which the signal encodes a sequence of instruction, or portion thereof, for execution by a machine (e.g., a computing device) and any related information (e.g., data structures and data) that causes the machine to perform any one of the methodologies and/or embodiments described herein.

Examples of a computing device include, but are not limited to, an electronic book reading device, a computer workstation, a terminal computer, a server computer, a handheld device (e.g., a tablet computer, a smartphone, etc.), a web appliance, a network router, a network switch, a network bridge, any machine capable of executing a sequence of instructions that specify an action to be taken by that machine, and any combinations thereof. In one example, a computing device may include and/or be included in a kiosk.

Figure 7:
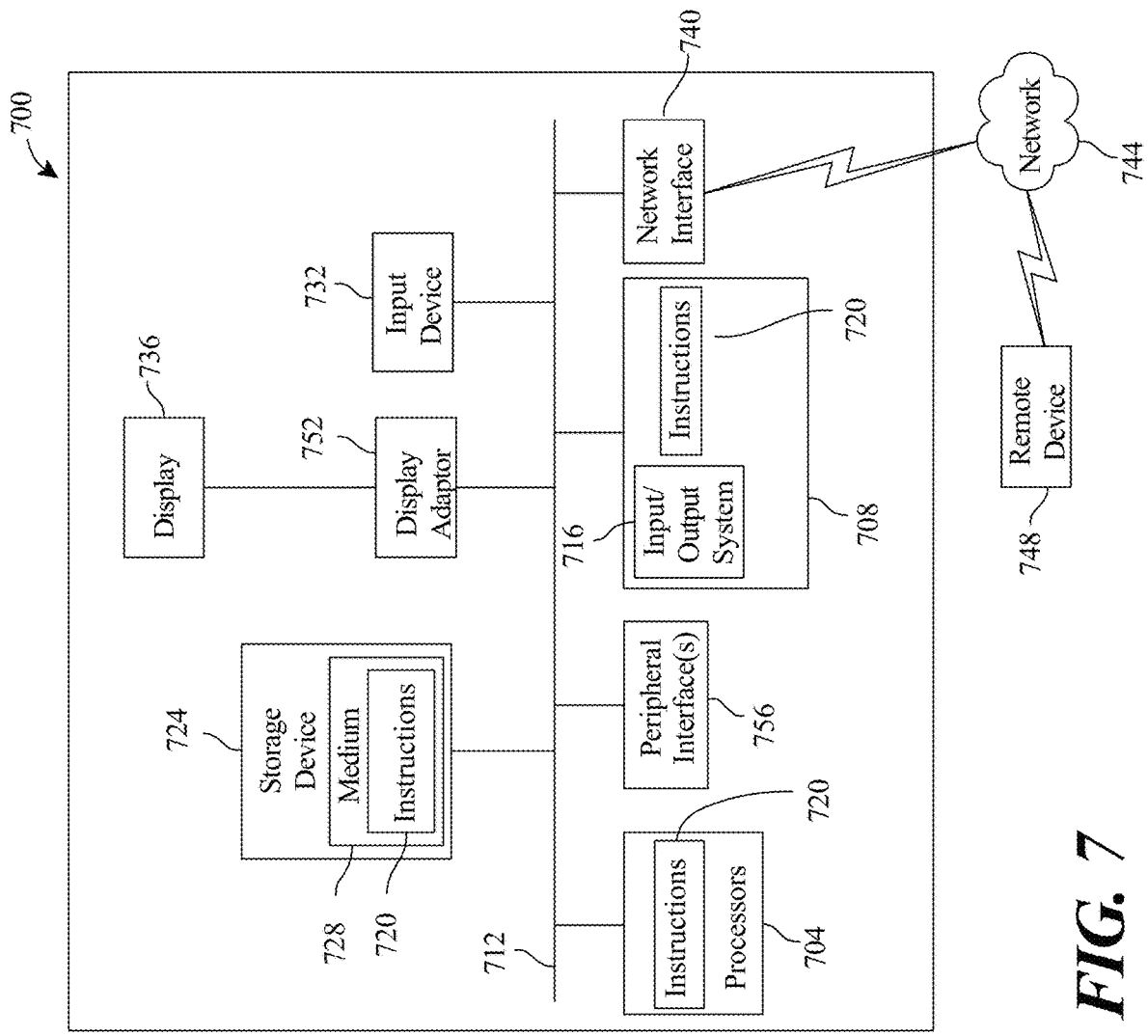
FIG. 7 is a block diagram of a computing system that can be used to implement any one or more of the methodologies disclosed herein and any one or more portions thereof.

FIG. 7 shows a diagrammatic representation of one embodiment of a computing device in the exemplary form of a computer system 700 within which a set of instructions for causing a control system to perform any one or more of the aspects and/or methodologies of the present disclosure may be executed. It is also contemplated that multiple computing devices may be utilized to implement a specially configured set of instructions for causing one or more of the devices to perform any one or more of the aspects and/or methodologies of the present disclosure. Computer system 700 includes a processor 704 and a memory 708 that communicate with each other, and with other components, via a bus 712. Bus 712 may include any of several types of bus structures including, but not limited to, a memory bus, a memory controller, a peripheral bus, a local bus, and any combinations thereof, using any of a variety of bus architectures.

Processor 704 may include any suitable processor, such as without limitation a processor incorporating logical circuitry for performing arithmetic and logical operations, such as an arithmetic and logic unit (ALU), which may be regulated with a state machine and directed by operational inputs from memory and/or sensors; processor 704 may be organized according to Von Neumann and/or Harvard architecture as a non-limiting example. Processor 704 may include, incorporate, and/or be incorporated in, without limitation, a microcontroller, microprocessor, digital signal processor (DSP), Field Programmable Gate Array (FPGA), Complex Programmable Logic Device (CPLD), Graphical Processing Unit (GPU), general purpose GPU, Tensor Processing Unit (TPU), analog or mixed signal processor, Trusted Platform Module (TPM), a floating point unit (FPU), and/or system on a chip (SoC).

Memory 708 may include various components (e.g., machine-readable media) including, but not limited to, a random-access memory component, a read only component, and any combinations thereof. In one example, a basic input/output system 716 (BIOS), including basic routines that help to transfer information between elements within computer system 700, such as during start-up, may be stored in memory 708. Memory 708 may also include (e.g., stored on one or more machine-readable media) instructions (e.g., software) 720 embodying any one or more of the aspects and/or methodologies of the present disclosure. In another example, memory 708 may further include any number of program modules including, but not limited to, an operating system, one or more application programs, other program modules, program data, and any combinations thereof.

Computer system 700 may also include a storage device 724. Examples of a storage device (e.g., storage device 724) include, but are not limited to, a hard disk drive, a magnetic disk drive, an optical disc drive in combination with an optical medium, a solid-state memory device, and any combinations thereof. Storage device 724 may be connected to bus 712 by an appropriate interface (not shown). Example interfaces include, but are not limited to, SCSI, advanced technology attachment (ATA), serial ATA, universal serial bus (USB), IEEE 1394 (FIREWIRE), and any combinations thereof. In one example, storage device 724 (or one or more components thereof) may be removably interfaced with computer system 700 (e.g., via an external port connector (not shown)). Particularly, storage device 724 and an associated machine-readable medium 728 may provide nonvolatile and/or volatile storage of machine-readable instructions, data structures, program modules, and/or other data for computer system 700. In one example, software 720 may reside, completely or partially, within machine-readable medium 728. In another example, software 720 may reside, completely or partially, within processor 704.

Computer system 700 may also include an input device 732. In one example, a user of computer system 700 may enter commands and/or other information into computer system 700 via input device 732. Examples of an input device 732 include, but are not limited to, an alpha-numeric input device (e.g., a keyboard), a pointing device, a joystick, a gamepad, an audio input device (e.g., a microphone, a voice response system, etc.), a cursor control device (e.g., a mouse), a touchpad, an optical scanner, a video capture device (e.g., a still camera, a video camera), a touchscreen, and any combinations thereof. Input device 732 may be interfaced to bus 712 via any of a variety of interfaces (not shown) including, but not limited to, a serial interface, a parallel interface, a game port, a USB interface, a FIREWIRE interface, a direct interface to bus 712, and any combinations thereof. Input device 732 may include a touch screen interface that may be a part of or separate from display 736, discussed further below. Input device 732 may be utilized as a user selection device for selecting one or more graphical representations in a graphical interface as described above.

A user may also input commands and/or other information to computer system 700 via storage device 724 (e.g., a removable disk drive, a flash drive, etc.) and/or network interface device 740. A network interface device, such as network interface device 740, may be utilized for connecting computer system 700 to one or more of a variety of networks, such as network 744, and one or more remote devices 748 connected thereto. Examples of a network interface device include, but are not limited to, a network interface card (e.g., a mobile network interface card, a LAN card), a modem, and any combination thereof. Examples of a network include, but are not limited to, a wide area network (e.g., the Internet, an enterprise network), a local area network (e.g., a network associated with an office, a building, a campus or other relatively small geographic space), a telephone network, a data network associated with a telephone/voice provider (e.g., a mobile communications provider data and/or voice network), a direct connection between two computing devices, and any combinations thereof. A network, such as network 744, may employ a wired and/or a wireless mode of communication. In general, any network topology may be used. Information (e.g., data, software 720, etc.) may be communicated to and/or from computer system 700 via network interface device 740.

Computer system 700 may further include a video display adapter 752 for communicating a displayable image to a display device, such as display device 736. Examples of a display device include, but are not limited to, a liquid crystal display (LCD), a cathode ray tube (CRT), a plasma display, a light emitting diode (LED) display, and any combinations thereof. Display adapter 752 and display device 736 may be utilized in combination with processor 704 to provide graphical representations of aspects of the present disclosure. In addition to a display device, computer system 700 may include one or more other peripheral output devices including, but not limited to, an audio speaker, a printer, and any combinations thereof. Such peripheral output devices may be connected to bus 712 via a peripheral interface 756. Examples of a peripheral interface include, but are not limited to, a serial port, a USB connection, a FIREWIRE connection, a parallel connection, and any combinations thereof.

The foregoing has been a detailed description of illustrative embodiments of the invention. Various modifications and additions can be made without departing from the spirit and scope of this invention. Features of each of the various embodiments described above may be combined with features of other described embodiments as appropriate in order to provide a multiplicity of feature combinations in associated new embodiments. Furthermore, while the foregoing describes a number of separate embodiments, what has been described herein is merely illustrative of the application of the principles of the present invention. Additionally, although particular methods herein may be illustrated and/or described as being performed in a specific order, the ordering is highly variable within ordinary skill to achieve methods and systems according to the present disclosure. Accordingly, this description is meant to be taken only by way of example, and not to otherwise limit the scope of this invention.

Exemplary embodiments have been disclosed above and illustrated in the accompanying drawings. It will be understood by those skilled in the art that various changes, omissions, and additions may be made to that which is specifically disclosed herein without departing from the spirit and scope of the present invention.

What is claimed is:

1. A system comprising:
   an electric propulsor comprising a motor;
   a sensor configured to:
      measure a current of the motor; and
      provide current data based on the measured current of the motor; and
   a computing device communicatively connected to the at least a sensor, the computing device configured to:
      receive the current data from the sensor;
      determine motor data including a current attributed to an axis based on the current data; and
      display a visual representation of the motor data.

2. The system of claim 1, wherein: the at least a sensor comprises further comprising:
   a temperature sensor; and the visual representation comprises configured to provide temperature data measured from the motor,
   wherein the computing device is communicatively connected to the temperature sensor and further configured to:
   receive the temperature data from the temperature sensor;
   generate a heat map based on the temperature data; and
   display the heat map of the motor.

3. The system of claim 2, wherein the temperature sensor comprises an infrared sensor.

4. The system of claim 1, further comprising:
   a vibration sensor configured to provide vibration data measured from the motor,
   wherein the computing device is communicatively connected to the vibration sensor and further configured to:
   receive the vibration data from the vibration sensor; and
   display the vibration data.

5. The system of claim 1, wherein the at least a further comprising:
   a torque sensor configured to provide output torque data measured from the motor,
   wherein the computing device is communicatively connected to the torque sensor and further configured to:
   receive the output torque data from the torque sensor; and
   display the output torque data.

6. The system of claim 1, further comprising:
   a voltage sensor configured to voltage data measured from the motor,
   wherein the computing device is communicatively connected to the voltage sensor and further configured to:
   receive the voltage data from the voltage sensor; and
   display the voltage data.

7. The system of claim 1, wherein the current attributed to an axis is attributed to a direct axis.

8. The system of claim 1, wherein the current attributed to an axis is attributed to a quadrature axis.

9. The system of claim 1, wherein the sensor is configured to measure a ripple current of the motor.

10. A method comprising:
    measuring, using a sensor, a current of a motor of an electric propulsor;
    providing, to a computing device, current data based on the measured current of the motor;
    receiving, at the computing device, the current data;
    determine motor data including a current attributed to an axis based on the current data; and
    displaying, by the computing device, the motor data.

11. The method of claim 10, further comprising:
    providing, to the computing device using a temperature sensor, temperature data measured from the motor; and
    displaying, by the computing device, a heat map of the motor generated based on the temperature data.

12. The method of claim 11, wherein the temperature sensor comprises an infrared sensor.

13. The method of claim 10, further comprising:
    providing, to the computing device using a vibration sensor, vibration data measured from the motor; and
    displaying, by the computing device, the vibration data.

14. The method of claim 10, further comprising:
    providing, to the computing device using a torque sensor, output torque data measured from the motor; and
    displaying, by the computing device, the output torque data.

15. The method of claim 10, further comprising:
    providing, to the computing device using a voltage sensor, voltage data measured from the motor; and
    displaying, by the computing device, the voltage data.

16. The method of claim 10, wherein the current attributed to an axis is attributed to a direct axis.

17. The method of claim 10, wherein the current attributed to an axis is attributed to a quadrature axis.

18. The method of claim 10, wherein the sensor is configured to measure a ripple current of the motor.

* * * * *